(12) United States Patent
Hara et al.

(10) Patent No.: US 8,723,623 B2
(45) Date of Patent: May 13, 2014

(54) ACOUSTIC WAVE DEVICE, METHOD OF MANUFACTURING ACOUSTIC WAVE DEVICE AND TRANSMISSION APPARATUS

(75) Inventors: Motoaki Hara, Kawasaki (JP); Tokihiro Nishihara, Kawasaki (JP); Shinji Taniguchi, Kawasaki (JP); Takeshi Sakashita, Kawasaki (JP); Tsuyoshi Yokoyama, Kawasaki (JP); Masafumi Iwaki, Kawasaki (JP); Masanori Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 294 days.

(21) Appl. No.: 12/503,583

(22) Filed: Jul. 15, 2009

(65) Prior Publication Data
US 2010/0019866 A1 Jan. 28, 2010

(30) Foreign Application Priority Data

Jul. 23, 2008 (JP) ................................. 2008-190280

(51) Int. Cl.
| | | |
|---|---|---|
| H03H 9/54 | (2006.01) | |
| H03H 3/02 | (2006.01) | |
| H03H 9/205 | (2006.01) | |
| H03H 9/56 | (2006.01) | |
| H03H 9/58 | (2006.01) | |

(52) U.S. Cl.
CPC ............ H03H 9/205 (2013.01); H03H 9/568 (2013.01); H03H 9/587 (2013.01); H03H 3/02 (2013.01); H03H 2003/021 (2013.01)
USPC .......... 333/189; 310/324; 310/349; 29/25.35; 29/594

(58) Field of Classification Search
USPC .................. 333/187–192; 310/322, 324, 349; 29/25.35, 594
See application file for complete search history.

(56) References Cited

U.S. PATENT DOCUMENTS

| | | | | |
|---|---|---|---|---|
| 4,642,508 | A * | 2/1987 | Suzuki et al. ................. | 310/321 |
| 5,910,756 | A * | 6/1999 | Ella .............................. | 333/133 |
| 6,060,818 | A | 5/2000 | Ruby et al. | |
| 6,355,498 | B1 * | 3/2002 | Chan et al. ..................... | 438/48 |
| 6,635,519 | B2 * | 10/2003 | Barber et al. ................. | 438/151 |
| 6,778,038 | B2 * | 8/2004 | Takeishi et al. ............... | 333/133 |

(Continued)

FOREIGN PATENT DOCUMENTS

| | | |
|---|---|---|
| CN | 1450719 A | 10/2003 |
| EP | 1 890 379 A1 | 2/2008 |

(Continued)

OTHER PUBLICATIONS

Chinese Office Action dated Mar. 5, 2013, in a counterpart Chinese patent application No. 200910151476.4.

(Continued)

*Primary Examiner* — Barbara Summons
(74) *Attorney, Agent, or Firm* — Chen Yoshimura LLP

(57) ABSTRACT

An acoustic wave device includes a substrate and a plurality of piezoelectric thin film resonators formed over the substrate. Each of the plurality of the piezoelectric thin film resonators includes lower electrode provided on the substrate, a piezoelectric film provided on the lower electrode, and an upper electrode provided on the piezoelectric film and opposed to the lower electrode through the piezoelectric film. Each of the piezoelectric thin film resonators is partly supported by the substrate and extends above the substrate to form a cavity between the substrate and each lower electrodes. The cavity continuously extending under the plurality of the piezoelectric thin film resonators.

12 Claims, 9 Drawing Sheets

(56) References Cited

U.S. PATENT DOCUMENTS

| | | | |
|---|---|---|---|
| 6,933,809 B2* | 8/2005 | Kyoung et al. | 333/193 |
| 7,253,705 B2 | 8/2007 | Song et al. | |
| 7,345,402 B2* | 3/2008 | Taniguchi et al. | 310/320 |
| 7,965,017 B2* | 6/2011 | Iwashita et al. | 310/321 |
| 2002/0121405 A1 | 9/2002 | Ruby et al. | |
| 2003/0088960 A1 | 5/2003 | Seo et al. | |
| 2003/0193269 A1* | 10/2003 | Jang et al. | 310/346 |
| 2003/0227338 A1* | 12/2003 | Kawakubo et al. | 331/107 A |
| 2005/0093656 A1 | 5/2005 | Larson, III et al. | |
| 2005/0110369 A1* | 5/2005 | Onishi et al. | 310/320 |
| 2005/0179508 A1* | 8/2005 | Sato | 333/187 |
| 2006/0255693 A1* | 11/2006 | Nishihara et al. | 310/365 |
| 2006/0284707 A1 | 12/2006 | Larson, III et al. | |
| 2007/0063622 A1 | 3/2007 | Ruby | |
| 2007/0085631 A1* | 4/2007 | Larson et al. | 333/187 |
| 2009/0001848 A1* | 1/2009 | Umeda et al. | 310/312 |
| 2009/0200899 A1 | 8/2009 | Osaka et al. | |
| 2010/0148637 A1 | 6/2010 | Satou | |

FOREIGN PATENT DOCUMENTS

| | | |
|---|---|---|
| JP | 2000-69594 A | 3/2000 |
| JP | 2002-314368 A | 10/2002 |
| JP | 2005-136992 A | 5/2005 |
| JP | 2005-333642 A | 12/2005 |
| JP | 2006-211296 A | 8/2006 |
| JP | 2007-6486 A | 1/2007 |
| JP | 2007-082218 A | 3/2007 |
| JP | 2007-134795 A | 5/2007 |
| JP | 2007-181185 A | 7/2007 |
| JP | 2007-208728 A | 8/2007 |
| JP | 2007-281846 A | 10/2007 |
| KR | 2003-0032534 A | 4/2003 |
| KR | 2003-0039446 A | 5/2003 |
| WO | 2006/080226 A1 | 8/2006 |
| WO | WO 2007/119556 * | 10/2007 |
| WO | WO 2008/032543 * | 3/2008 |

OTHER PUBLICATIONS

Japanese Office Action dated Dec. 4, 2012, in a counterpart Japanese patent application No. 2008-190280.

Chinese Office Action dated Nov. 5, 2013, in a counterpart Chinese patent application No. 200910151476.4.

* cited by examiner

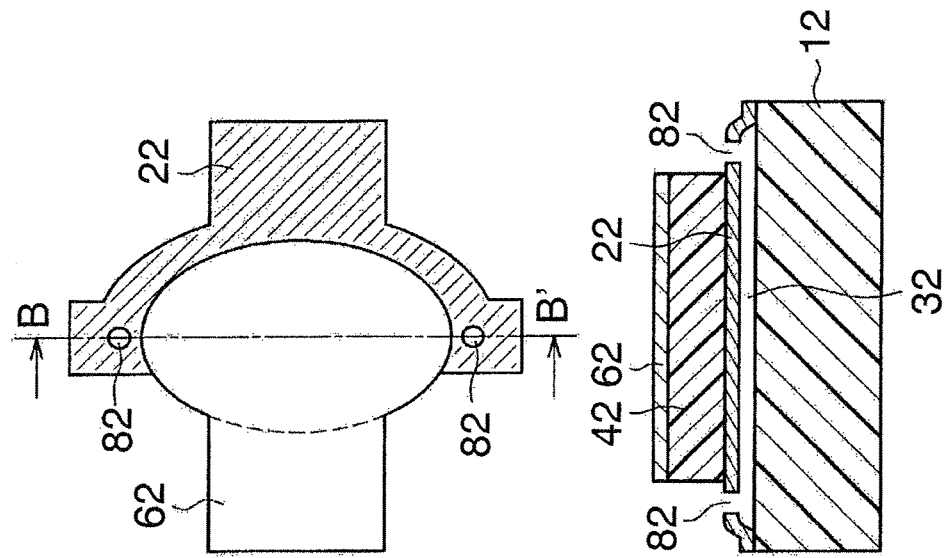
Fig. 5C
Fig. 5D
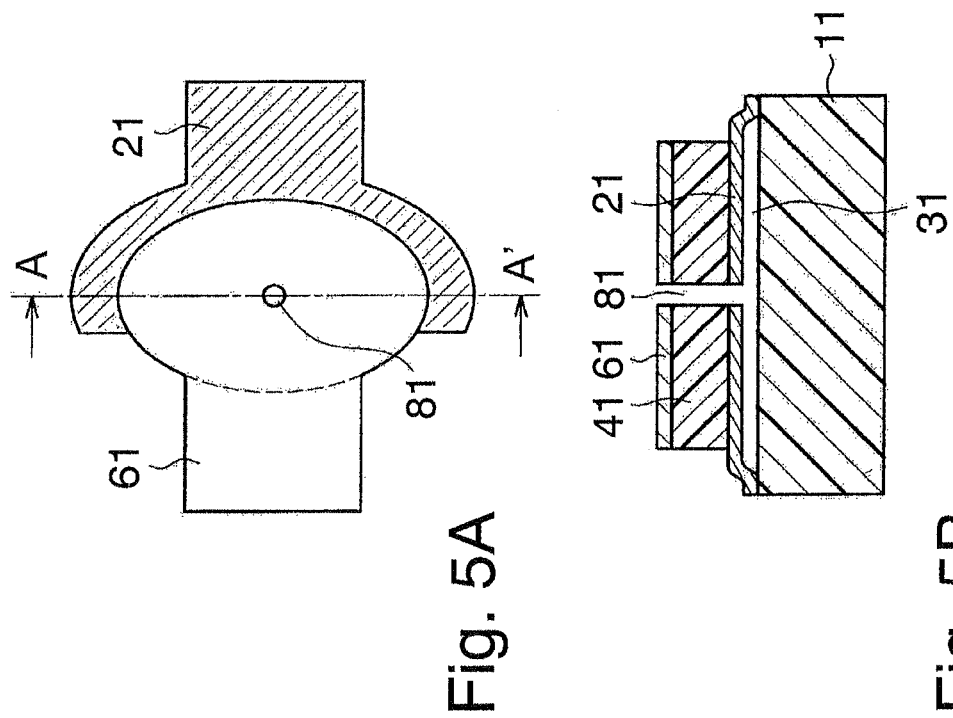
Fig. 5A
Fig. 5B

ACOUSTIC WAVE DEVICE, METHOD OF MANUFACTURING ACOUSTIC WAVE DEVICE AND TRANSMISSION APPARATUS

CROSS-REFERENCE TO RELATED APPLICATIONS

This application is based upon and claims the benefit of priority of the prior Japanese Patent Application No. 2008-190280, filed on Jul. 23, 2008, the entire contents of which are incorporated herein by reference.

FIELD

The embodiments present invention relates to an acoustic wave device, a fabrication method, and a transmission apparatus using the acoustic device.

BACKGROUND

Along with rapid diffusion of wireless devices typified by cell phones, it is growing a demand for a compact, lightweight resonator and a filter that combines the resonators. For this demand, a piezoelectric thin-film resonator have attracted attentions, while a dielectric filter and a surface acoustic wave (SAW) filter have been mainly used. Because the piezoelectric thin-film resonator is a device with an excellent characteristic relative to, especially, a high frequency, which can be downsized and monolithically integrated.

The piezoelectric thin-film resonator may be classified in such as a Film Bulk Acoustic Resonator (FBAR) and a Solidly Mounted Resonator (SMR). The FBAR is configured by laminating a lower electrode, a piezoelectric membrane, and an upper electrode on a substrate. A cavity space is formed below a portion where the lower electrode and the upper electrode oppose each other across the piezoelectric membrane which resonates, where the portion is called as a membrane region.

Here, two types of the cavity space in the FBAR are known, one is a cavity space (cavity) formed between the membrane region and the other is a cavity space (via hole) formed through the substrate below the membrane region.

The via hole is formed in the substrate through wet etching, dry etching, or the like. An FBAR having a via hole (hereinafter referred to as "via hole type FBAR") is manufactured based on, for example, a substrate back side Via process.

One example of a manufacturing method for an FBAR having a cavity (hereinafter referred to as "cavity type FBAR") is a substrate surface processing method, which is shown in Japanese Laid-open Patent Publication No. 2000-69594 for example. The other example is an air bridge method, which is shown in Japanese Laid-open Patent Publication No. 2006-211296 and No. 2007-208728 for example. Either method can form a cavity by wet-etching a sacrifice layer formed between a substrate surface and a membrane region.

In the methods, for example, a sacrifice material is formed in a region for forming a cavity in advance, and then a lower electrode a piezoelectric membrane, and an upper electrode are formed thereon, where the electrodes and the piezoelectric membrane mainly constitute a piezoelectric thin-film resonator. After the lamination of these layer, a through-hole is formed to reach the sacrifice layer from an upper surface of the piezoelectric thin-film resonator, and the sacrifice layer is removed by executing etching through the through-hole.

Since the manufacturing process of the cavity type FBAR needs no process forming the cavity space from the rear side (back side) of the substrate, the cavity type FBAR is more suitable for mass-production than the via hole type FBAR form the viewpoint of a process for dicing a chip to handle each diced chip.

As shown above, the cavity type FBAR needs a portion on a surface of the device for an inlet and flow channel of an etchant for removing a sacrifice layer. The portion becomes a dead space not functioning as a resonator. In particular, the dead space is a big barrier to size reduction in a ladder type filter configured by connecting plural FBARs with each other.

As a countermeasure against this problem, proposed is a method for forming an inlet of an etchant for removing a sacrifice layer on the rear side (back side) of the substrate, which is shown for example in Japanese Laid-open Patent Publication 2005-333642.

SUMMARY

According to an aspect of the invention, an acoustic wave device includes a substrate and a plurality of piezoelectric thin film resonators formed over the substrate. Each of the plurality of the piezoelectric thin film resonators includes lower electrode provided on the substrate, a piezoelectric film provided on the lower electrode, and an upper electrode provided on the piezoelectric film and opposed to the lower electrode through the piezoelectric film. Each of the piezoelectric thin film resonators is partly supported by the substrate and extends above the substrate to form a cavity between the substrate and each lower electrodes. The cavity continuously extends under the plurality of the piezoelectric thin film resonators.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3A is a top plan view of the semifinished device, FIG. 3B is a section view of the semifinished device along the line A-A' shown in FIG. 3A, and FIG. 3C is a section view along the line B-B' in FIG. 3A;

FIG. 5A is a plan view of a structure where a through-hole formed at the center of a resonator area, FIG. 5B is a sectional view of the structure taken along the line A-A' in FIG. 5B, FIG. 5C is a plan view of the structure where a through-hole is formed at an outer peripheral portion of a cavity region and outside the resonant area, and FIG. 5D is a sectional view of the structure taken along the line A-A' in FIG. 5C;

DESCRIPTION OF EMBODIMENTS

Figure 1:
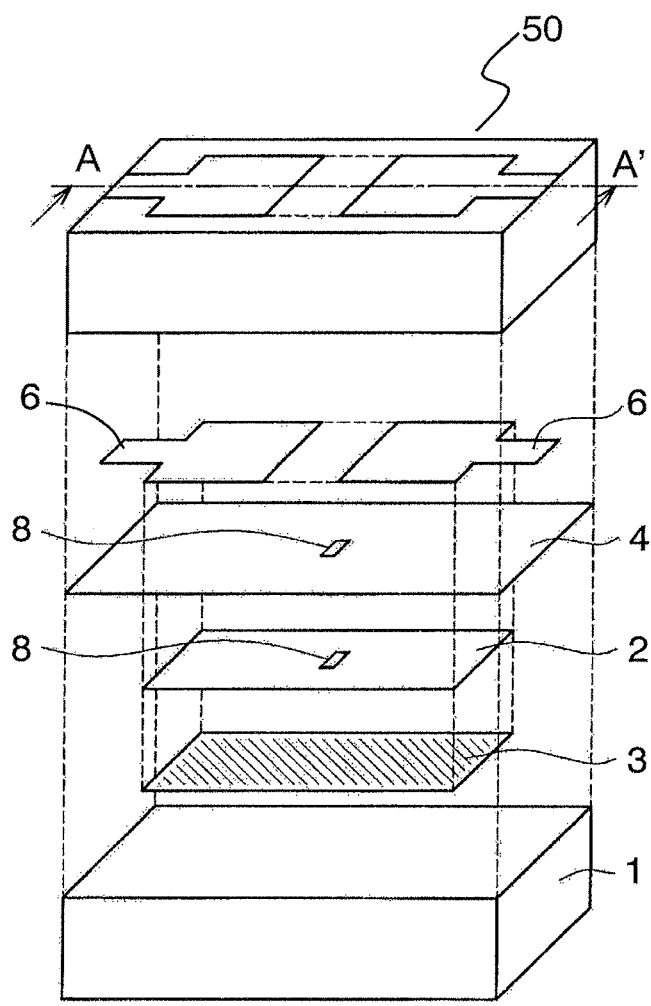
FIG. 1 is a perspective view of a semifinished device in the process for manufacturing an acoustic wave device and an exploded perspective view showing a layer structure of the semifinished device in an exploded form.

As described previously, the proposed method for forming then inlet of the etchant for removing the sacrifice layer on the rear side or the back side of the substrate impairs the productivity that is an advantage of the cavity type FBAR.

Preferred embodiments of the present invention will be explained with reference to accompanying drawings.

According to an embodiment, the plurality of piezoelectric thin-film resonators may also share a lower electrode. By sharing the lower electrode among the plurality of piezoelectric thin-film resonators, the structure where one cavity space is shared therebetween may be easily achieved.

Further it is preferable to form a through-hole in a region other than the membrane region of each of the piezoelectric thin-film resonators such that the through-hole reaches the cavity space from an upper surface of each of the piezoelectric thin-film resonators. By forming the through-hole in the region other than the membrane region, it may be possible to prevent a characteristic of the piezoelectric thin-film resonator from a deterioration caused by an increase of an area of an end portion of the piezoelectric membrane.

On the other hand, by forming a through-hole at around the center of a region occupied by the cavity space on the substrate, a membrane region of the piezoelectric thin-film resonator is less likely to contact to the substrate than in the case of forming a through-hole at around a peripheral portion of the region. As a result, a characteristic of the piezoelectric thin-film resonator is stabilized.

According to an embodiment of the present invention, the cavity space may be formed on the flat substrate. Therefore, a piezoelectric membrane shared among a plurality of piezoelectric thin-film resonators formed on the cavity space can be made flat along the cavity space. Thus, a discontinuous surface of the piezoelectric membrane is less likely to appear between the piezoelectric thin-film resonators. As a result, the piezoelectric thin-film resonators may be arranged close to each other, and the acoustic wave device may be downsized more easily.

According to an embodiment of the present invention, a cavity space is preferably formed such as a domical protrusion against the substrate. As a result, the lower electrode facing the cavity space can be prevented from contacting to the substrate in the membrane region of the piezoelectric thin-film resonator.

According to an embodiment of the present invention, the piezoelectric membrane is made of either aluminum nitride or zinc oxide each of which has a orientation showing a principal axis of (002) direction. These materials may provide an acoustic wave device including a piezoelectric thin-film resonator having favorable resonant characteristics.

The First Embodiment

The manufacturing method for an acoustic wave device includes: forming a sacrifice layer for forming a cavity space on a substrate; forming on the sacrifice layer a plurality of membrane regions, each of which includes an upper electrode and a lower electrode opposing each other across the piezoelectric membrane, by forming a lower electrode layer, a piezoelectric membrane layer, and an upper electrode layer on the sacrifice layer and the substrate; forming a through-hole through at least one of the lower electrode, the piezoelectric membrane, and the upper electrode; and supplying an etchant from the through-hole to remove the sacrifice layer.

According to the manufacturing method, it may be possible to reduce the number of through-holes compared with the case of forming a sacrifice layer for each of a plurality of membrane regions, since the plurality of membrane regions are formed on the sacrifice layer. Hence, a downsized acoustic wave device may be manufactured.

[Structure of Acoustic Wave Device]

An acoustic wave device according to a first embodiment is obtained using a cavity type FBAR. FIG. 1 is a perspective view of a semifinished device 50 in the process for manufacturing an acoustic wave device and an exploded perspective view showing a layer structure of the semifinished device in an exploded form. The semifinished device 50 of the acoustic wave device in FIG. 1 includes a substrate 1, a sacrifice layer 3, a lower electrode 2, a piezoelectric membrane 4, and two upper electrodes 6. Since the sacrifice layer 3 will be finally removed, a region of the sacrifice layer 3 becomes a cavity. A through-hole is formed at around the central portions of the piezoelectric membrane 4 and the lower electrode 2 to reach the sacrifice layer 3 therethrough. The thus-formed through-hole 8 is used to remove the sacrifice layer 3.

Figure 2A:
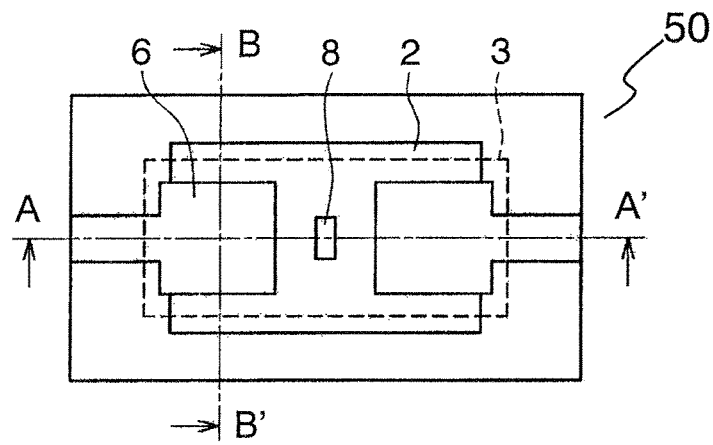
FIG. 2A is a top plan view of the semifinished device shown in FIG. 1.
Figure 2B:
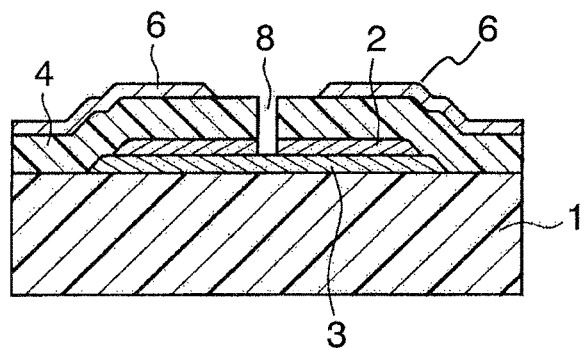
FIG. 2B is a section view of the semifinished device along the line A-A' shown in FIG. 2A.
Figure 2C:
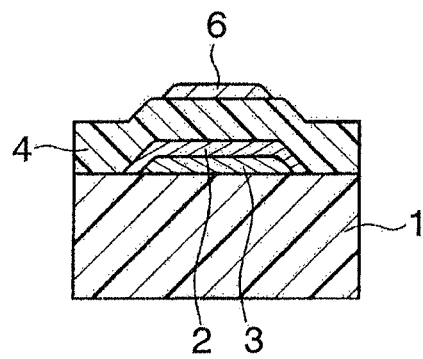
FIG. 2C is a section view along the line B-B' in FIG. 2A.

FIG. 2A is a plan view of the semifinished device 50 in FIG. 1 as viewed from above. In FIG. 2A, a region for forming the sacrifice layer 3, which is removed in a later process to form a cavity, is indicated by the dotted line. FIG. 2B is a sectional view taken along the line A-A' in FIG. 2A. FIG. 2C is a sectional view taken along the line B-B' in FIG. 2A.

As shown in FIGS. 2A to 2C, in the semifinished device of the acoustic wave device in this embodiment, one sacrifice layer 3 is formed on the substrate 1, and one lower electrode 2 is laminated on almost the entire upper surface of the sacrifice layer 3. Moreover, the piezoelectric membrane 4 is formed over the entire substrate surface to cover the sacrifice layer 3 and the lower electrode 2. The two upper electrodes 6 are each formed opposite to the lower electrode 2 across the piezoelectric membrane 4. A membrane region is a region where the lower electrodes 2 and the upper electrodes 6 oppose each other across the piezoelectric membrane 4. One membrane region corresponds to one FBAR.

In this embodiment, two membrane regions are formed on one sacrifice layer 3. With this structure, two FBARs are formed on one sacrifice layer 3. After the removal of the sacrifice layer 3 to form a cavity, two FBARs are formed on one cavity. That is, an acoustic wave device including plural FBARs sharing a cavity is obtained. In the illustrated examples of FIG. 1 and FIGS. 2A to 2C, the two FBARs share the lower electrode 2 as well. In this way, in the acoustic wave device of this embodiment, the two FBARs sharing the lower electrode share the sacrifice layer 3.

Here, the lower electrode 2 and the upper electrodes 6 can be formed of, for example, aluminum (Al), copper (Cu), molybdenum (Mo), tungsten (W), tantalum (Ta), Platinum (Pt), ruthenium (Ru), rhodium (Rh), iridium (Ir), chromium (Cr), and titanium (T), or a laminate material containing a combination thereof. The piezoelectric membrane 4 may be made of, for example, aluminum nitride (AlN), zinc oxide (ZnO), lead zirconate titanate (PZT), or lead titanate (PbTiO$_3$). Further, the substrate 10 may be made of, for example, silicon, glass, or GaAs.

In the illustrated examples of FIG. 1 and FIGS. 2A to 2C, the membrane region is rectangular as viewed from above but may have an arbitrary shape such as an elliptical or pentagonal shape in practice. Further, the layer structure of the FBAR is not limited to the above structure including the lower electrode 2, the piezoelectric membrane 4, and the upper electrodes 6. For example, a support layer made of aluminum nitride may be disposed between the substrate 1 and the lower electrode 2. With this structure, the membrane region can be supported more stably.

Figure 3A:
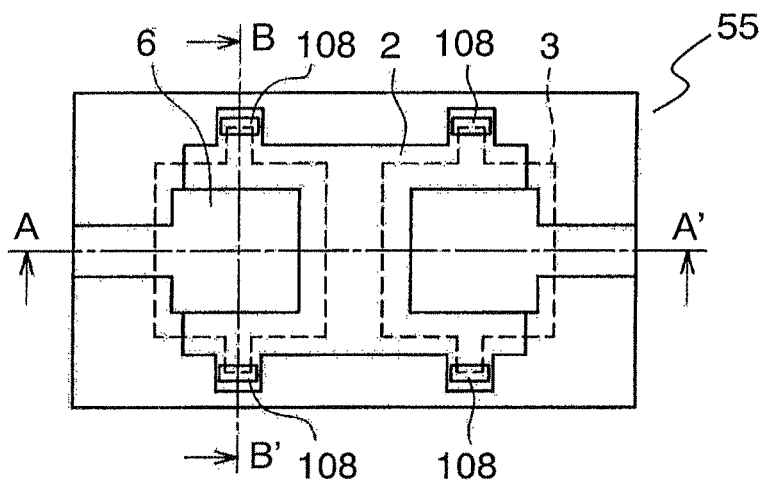
FIGS. 3A to 3C are a semifinished device of an acoustic wave device having each cavity for respective FBAR.
Figure 3B:
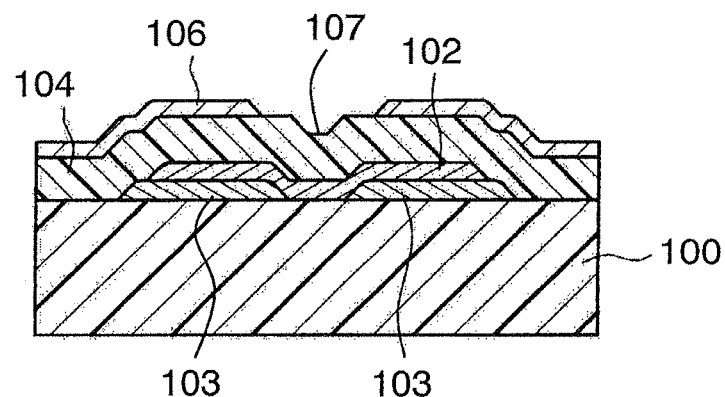
Figure 3C:
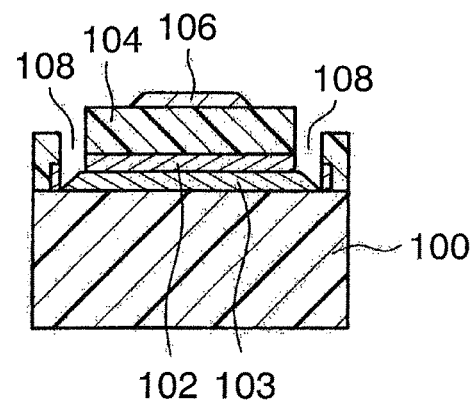

FIGS. 3A to 3C are diagrams showing an example of a semifinished device 55 of an acoustic wave device including cavities formed for each FBAR. FIG. 3A is a plan view of the semifinished device 55 as viewed from above. In FIG. 3A, a region for forming the sacrifice layer 3, which is removed in a later process to form a cavity, is indicated by the dotted line. FIG. 3B is a sectional view taken along the line A-A' in FIG. 3A. FIG. 3C is a sectional view taken along the line B-B' in FIG. 3A.

In the illustrated example of FIGS. 3A to 3B, two sacrifice layers 103 are formed on a substrate 100. On each of the two sacrifice layers 103, formed is a membrane region, more specifically, an FBAR where a lower electrode 102 and an upper electrode 106 oppose each other across a piezoelectric membrane 104. The sacrifice layer 103 will be finally removed to form a cavity. Each through-hole 108 is formed to remove the sacrifice layers 103.

In the illustrated example of FIGS. 3A to 3B, the membrane region of each FBAR is lifted by the sacrifice layer 103. Thus, a piezoelectric membrane positioned between adjacent FBARs is tapered at a lower level than the surrounding portions.

If a piezoelectric material which has Wrutzite crystal structure, for example AlN or ZnO, is used as the piezoelectric membrane 104, the orientation in the membrane of a taper region 107 between FBARs (FIG. 3B) tends to be discontinuous, and the discontinuity easily may crack. In particular, the more closely the adjacent FBARs are formed, the more easily the discontinuity of the orientation tends to occur. The structure in FIGS. 3A to 3C has a practical limitation in shortening a distance between FBARs.

In contrast, the acoustic wave device 50 illustrated in FIGS. 1, 2A to 2C has not a taper portion, such as the taper region 107 in FIG. 3C, in the piezoelectric membrane 4 positioned between the FBARs. Thus, the piezoelectric membrane 4 of the acoustic wave device 50 is kept flat along the flat substrate surface. Hence, even if a piezoelectric material having strong orientation is used as a piezoelectric membrane, a piezoelectric membrane positioned between the FBARs does not show discontinuous orientation, and crack destruction is less likely to occur. As a result, a distance between adjacent FBARs can be reduced down to the limit of lithography. In this way, the structures of FIGS. 1, 2A to 2C allows the number of sacrifice layers to be unified instead of forming sacrifice layers for each FBAR, and a distance between FBARs may be considerably reduced.

Further, since each sacrifice layer 103 is provided in an individual FBAR in such a structure of FIGS. 3A to 3C, the through-hole 108 should be formed for each sacrifice layer 103. As a result, more through-holes are required than in the structures in FIG. 1 and FIGS. 2A to 2C. This through-hole does not function as a resonator, while the trough-hole serves to remove the sacrifice layer in the process of manufacturing. Therefore, the through-hole becomes a dead space on a chip to downsize the acoustic wave device.

On the other hand, if plural FBARs share a sacrifice layer as shown in FIG. 1 and FIGS. 2A to 2C, the number of through-holes can be reduced, which contributes to size reduction of a device. By downsizing a device, the yield of wafer may be increased, which gives an advantage in cost.

[Manufacturing Method for Acoustic Wave Device]

Figure 4A:
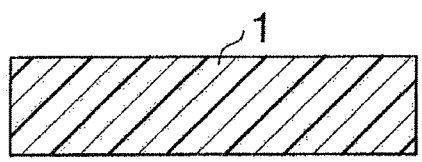
FIGS. 4A to 4J are diagrams depicting a process of manufacturing the acoustic wave device depicted in FIGS. 1, 2A to 2C.
Figure 4F:
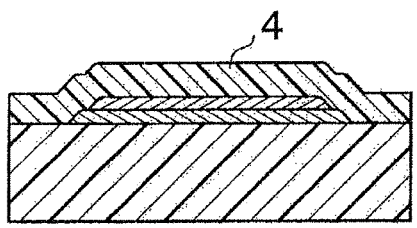
Figure 4B:
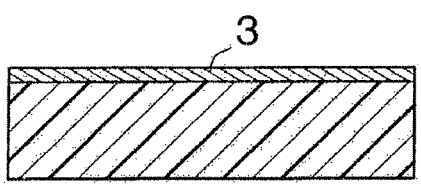

FIGS. 4A to 4J illustrate a manufacturing process for the acoustic wave device 50 shown in FIG. 1 and FIGS. 2A to 2C. First, MgO forming the sacrifice layer 3 is formed into a film (thicknesses of about 20 nm) on an Si substrate 1 (or quartz substrate) through sputtering or vacuum evaporation (FIGS. 4A to 4B). The sacrifice layer 3 may be formed of any material that may be dissolved into an etchant such as ZnO, Ge, and Ti in addition to MgO without any particular limitation.

Figure 4G:
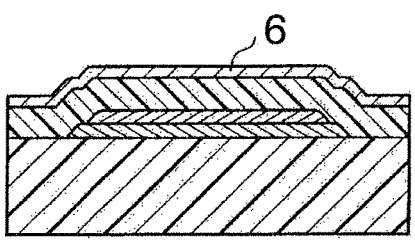
Figure 4C:
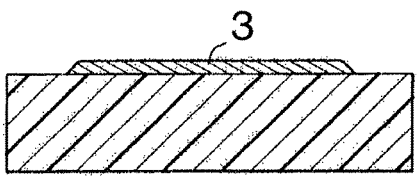

Next, the sacrifice layer 3 is patterned into a desired shape through photolithography and etching (FIG. 4C).

Figure 4H:
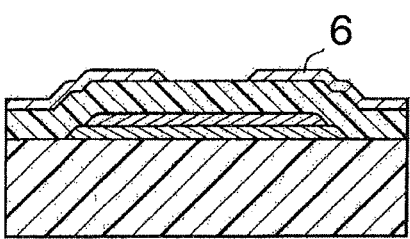
Figure 4D:
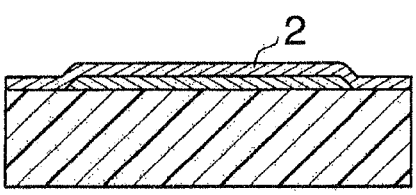
Figure 4I:
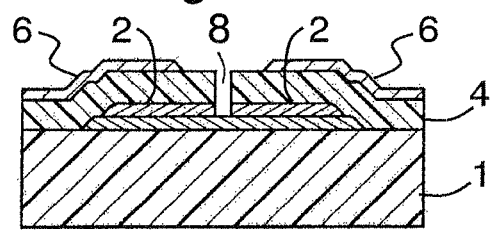
Figure 4E:
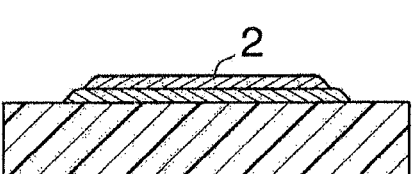

Next, the lower electrode 2, the piezoelectric membrane 4, and the upper electrode 6 are formed in order (FIGS. 4D to 4G). More specifically, the lower electrode 2 is made up of laminate film that is formed through sputtering in an Ar gas atmosphere under the pressure of 0.6 to 1.2 Pa (FIG. 4D) and in addition, patterned into a desired shape through photolithography and etching (FIG. 4E). After that, AlN forming the piezoelectric membrane 4 is formed into a film through sputtering using an Al target in an Ar/N2 mixed gas atmosphere under the pressure of about 0.3 Pa (FIG. 4F). Then, an Ru film as the upper electrode 6 is formed into a film through sputtering u in an Ar gas atmosphere under the pressure of about 0.6 to 1.2 Pa (FIG. 4G).

Here, if aluminum nitride or zinc oxide showing (002) preferred orientation is used for the piezoelectric membrane 4, an FBAR having more favorable resonant characteristics may be manufactured.

Figure 4J:
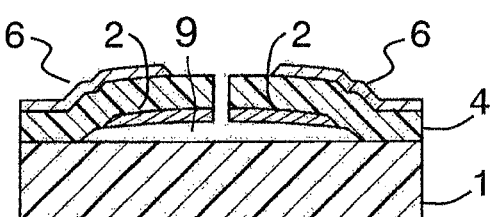

The thus-formed laminate is subjected to photolithography and etching (wet etching or dry etching) to pattern the upper electrodes 6 and the piezoelectric membrane 4 into a desired shape (FIG. 4H). Upon this patterning process, the through-hole 8 is formed in the piezoelectric membrane 4 (FIG. 4I). An etchant is supplied from the through-hole 8 for leading an etchant to etch the sacrifice layer 3 off to thereby form a cavity space (cavity) 9 (FIG. 4J).

In the state of FIG. 4I, it is preferable to configure a composite film including the lower electrode 2, the piezoelectric membrane 4, and the upper electrodes 6 in a state of the composite film compressively-stressed. With this structure, the composite film expands as shown in FIG. 4J to form the domical cavity 9 between the lower electrode 2 and the substrate 1. To give an example thereof, if a compression stress of 300 Mpa is set for the composite film, the domical cavity 9 may be formed.

In this way, if the cavity is formed into a domical shape, the lower electrode 2 is kept from adhering to the substrate 1. Further, the thickness of the sacrifice layer 3 for forming the cavity 9 may be reduced. Here, the domical shape may be such a shape that a peripheral portion of the cavity 9 is at a low level, and its height increases toward the inner portion of the cavity. Further, a method for forming a domical cavity is not limited to the above one.

[Positional Relationship Between Through-Hole and Cavity]

A positional relationship between a through-hole and a cavity is described next. FIGS. 5A and 5B show a structural example of the cavity type FBAR for illustrating the relationship. FIG. 5A is a plan view of the structure where an inlet (through-hole 81) for an etchant used to etch off a sacrifice layer is formed at the center of a resonator area (membrane region) and FIG. 5B is a sectional view of the structure taken along the line A-A' in FIG. 5A, FIG. 5C is a plan view of the structure where a through-hole 81 is formed at an outer peripheral portion of a cavity region and outside the resonant area (surrounding area) and FIG. 5D is a sectional view of the structure taken along the line A-A' in FIG. 5C.

In an FBAR in FIGS. 5A and 5B, the through-hole 81 is formed at the center (center as viewed from above) of a region, or a membrane region, where a lower electrode 21 opposes an upper electrode 61 across a piezoelectric membrane 41. A cavity 31 is slightly larger than the membrane region and thus, the through-hole 81 is also positioned at the center of the cavity 31.

In FIGS. 5C and 5D, a through-hole 82 is formed outside a region, or a membrane region, where a lower electrode 22 opposes an upper electrode 62 across a piezoelectric membrane 42 and at an outer peripheral portion close to an outer edge of a cavity 32 as shown in FIG. 5D.

Figure 6A:
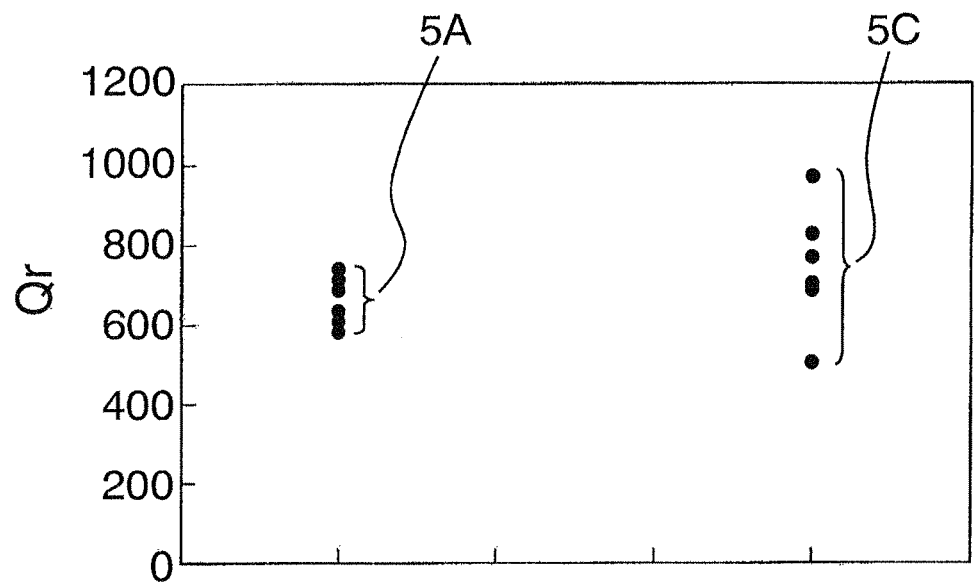
FIGS. 6A and 6B are graphs showing load resonance Q (Qr) and load anti-resonance Q (Qa), respectively.
Figure 6B:
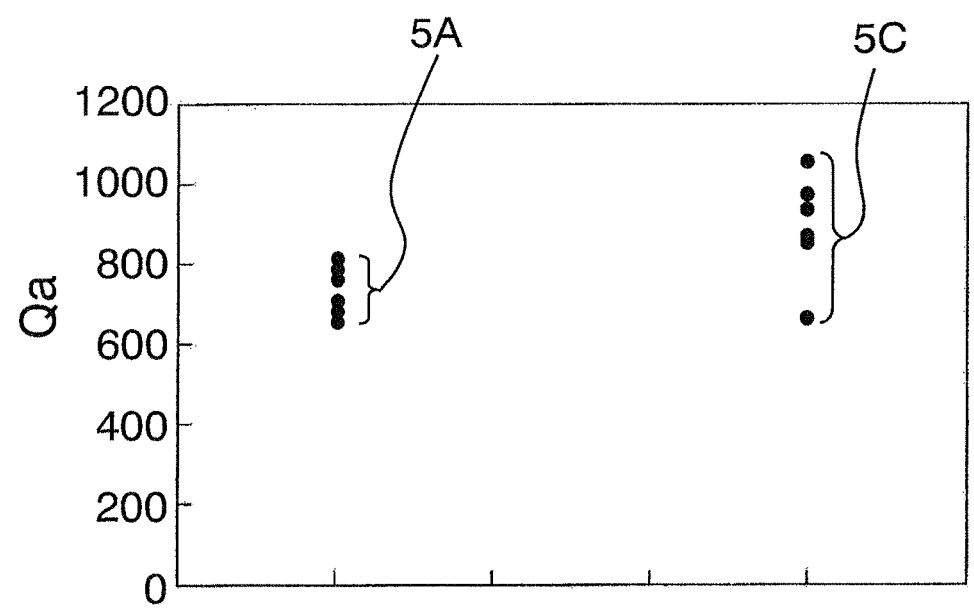

Data denoted by 5A or 5C in FIGS. 6A and 6B is corresponding to characteristic of a quality factor Q of the FBARs including the configuration shown in FIGS. 5A and 5B or FIGS. 5C and 5D, respectively. FIG. 6A is a graph showing loaded resonance Q (Qr). FIG. 6B is a graph showing loaded anti-resonance Q (Qa).

Comparing data 5A with data 5C in FIGS. 6A and 6B, the characteristics of the FBAR including the structure shown in FIGS. 5A and 5B is more stable than those of the FBAR including the structure shown in FIGS. 5C and 5D, because distribution of data 5A is narrower than that of data 5C. That is, a FBAR having a through-hole formed at around the center of a sacrifice layer or a cavity provides more stable Q characteristics than that having a through-hole formed at a peripheral portion of the sacrifice layer or the cavity. The reason thereof will be described in detail below.

In the process subsequent to removal of the sacrifice layer through etching, a chemical agent for removing the sacrifice layer is substituted or eliminated well with a rinse agent such as pure water. Then, after the rinse agent has been dried, a cavity type FBAR is completed. In this rinsing process, several kinds of organic solvents may be used as a rinse agent.

In the drying process after the removal of the sacrifice layer, surface tension acts when the rinse agent is drying. As a result, a force of adhering to the substrate is generated in a membrane region. In the structure of FIGS. 5C and 5D, the rinse agent is dried first at the peripheral portion. Thus, the force of adhering to the substrate is maximized at the center of the membrane region.

On the other hand, in the structure of FIGS. 5A and 5B, the rinse agent is dried first at the center of the membrane region. Thus, the force of adhering to the substrate is maximized at the peripheral portion of the membrane region.

Since the FBAR is the thin-film structure, the central portion of the membrane region tends to flexural deform, while the peripheral portion of the membrane region is less likely to flexural deform. Thus, if similar surface tension acts on the center of the membrane region and on the peripheral portion, adhesion to the substrate is lower in the case where the surface tension acts on the peripheral portion. Therefore, it is considered that characteristics (5As in FIG. 6A) of the FBAR having the structure shown in FIGS. 5A and 5B are more stabilized than the characteristics (5Cs in FIGS. 6A and 6B) of the FBAR having the structure shown in FIGS. 5C and 5D.

The fact that characteristics are more stabilized in the case where an inlet for an etchant is formed at the center of the resonant area (membrane region) of the FBAR is described above. The average values of Q factors of the FBAR of FIGS. 5A and 5B, however, are smaller than those of the FBAR of FIGS. 5C and 5D as shown in FIGS. 6A and 6B. The reason thereof will be described in detail below.

Upon the formation of each film such as a piezoelectric membrane, an upper electrode, and a lower electrode, an edge of each film is not vertical to the substrate surface in many cases. For example, upon film processing based on photolithography, each film is usually formed with an inclined edge.

The acoustic waves of thickness mode at a resonance and an anti-resonance frequencies propagate not only in the normal direction of the substrate surface but also in the substrate surface direction. Therefore, the wave propagating in the substrate surface direction is obliquely reflected at the edge of the piezoelectric membrane, if the edge has an angle to the substrate surface. As a result, a mode other than the vibration of thickness extensional mode wave is induced.

The piezoelectric membrane of the FBAR has usually a polarization axis in the normal direction to the substrate surface. Therefore, the vibration may do not induce piezoelectric effect if the acoustic wave has no displacement in the directions other than the normal direction to the substrate surface, and a vibration energy thereof leads to an energy loss. After all, the Q factor is reduced.

As shown in FIGS. 5A and 5B, an area of an end portion of the piezoelectric membrane increases relative to an area of the resonator. As a result, the Q factor is reduced.

Considering the above-described results in FIGS. 6A and 6B, it may prevent the plural FBARs from the poor characteristics and may provides stable characteristics by forming a through-holes 8 at almost the center of the sacrifice layer 3 which is shared by the plural FBARs, The FBARs having the such structure, shown in FIGS. 1 and 2A to 2C, have no edge due to the through-hole 8 within the each membrane regions. Therefore, the structure shown in FIGS. 1 and 2A to 2B may lead to high productivity and may achieve better characteristics of the FBARS.

Here, the center of the sacrifice layer 3 (or cavity) is not strictly limited to the center but may be set to a position away from the outer edge such that the peripheral portion of the cavity is dried last in the drying process after the removal process of the sacrifice layer.

Second Embodiment

A second embodiment relates to a filter using the acoustic wave device of the first embodiment. The filter using FBARs is mainly a ladder type filter. The ladder type filter is structured such that a series resonator and a parallel resonator ares connected in series and in parallel respectively between an input terminal Tin and an output terminal Tout.

Figure 7A:
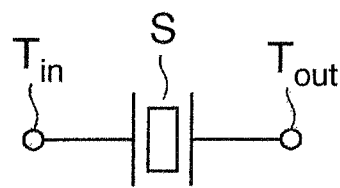
FIGS. 7A and 7B are equivalent circuit diagrams of a series resonator S and a parallel resonator P, respectively.
Figure 7B:
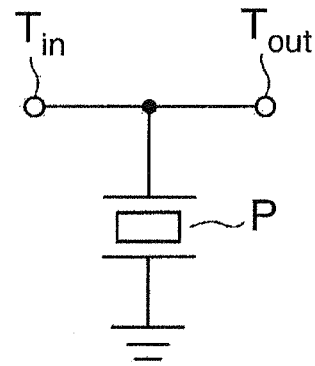
Figure 7C:
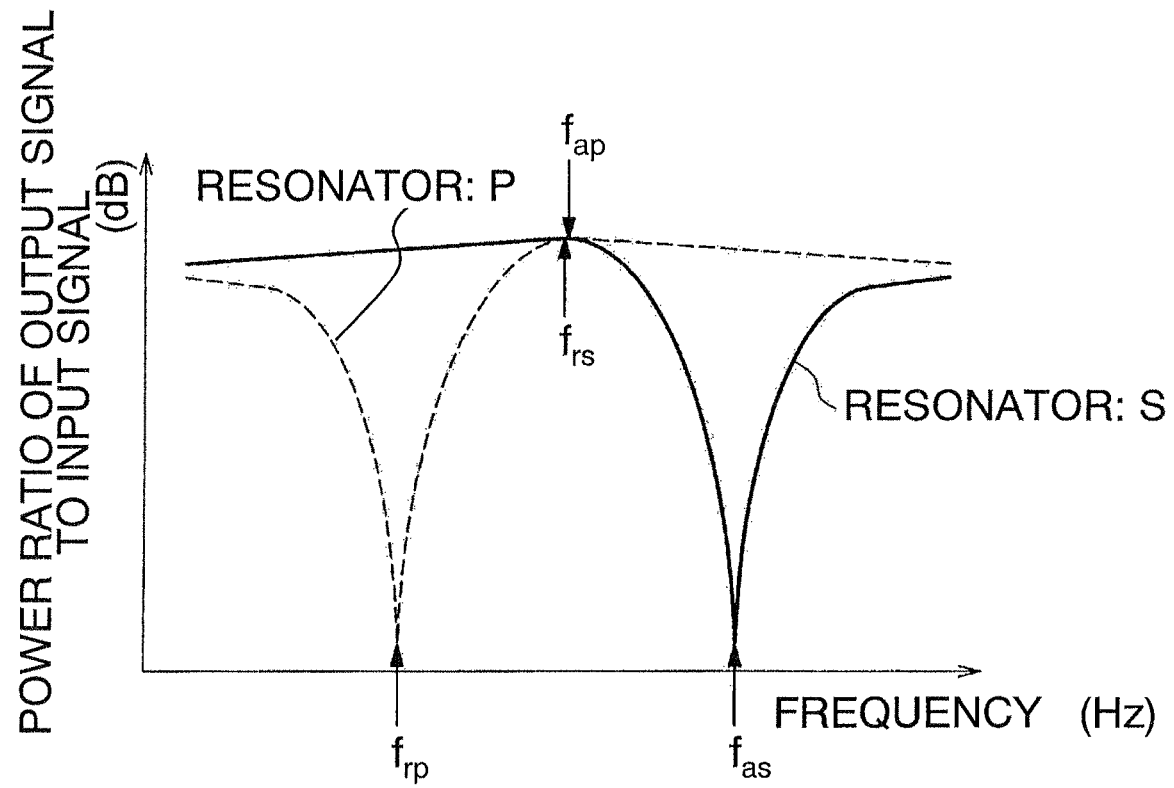
FIG. 7C is a graph depicting frequency characteristics of the series resonator S and the parallel resonator P.

FIGS. 7A and 7B are equivalent circuit diagrams of a series resonator S and a parallel resonator P, respectively. FIG. 7C is a graph showing frequency characteristics of the series resonator S and the parallel resonator P. A passage amount (indicated by the solid line), which is a ratio of an amplitude response of an output power to an input power, of the series resonator S shows the maximum value at a resonance frequency frs and the minimum value at an anti-resonance frequency fas. A passage amount (indicated by the dotted line) of the parallel resonator P shows the minimum value at a resonance frequency frs and the maximum value at an anti-resonance frequency fas.

Figure 8A:
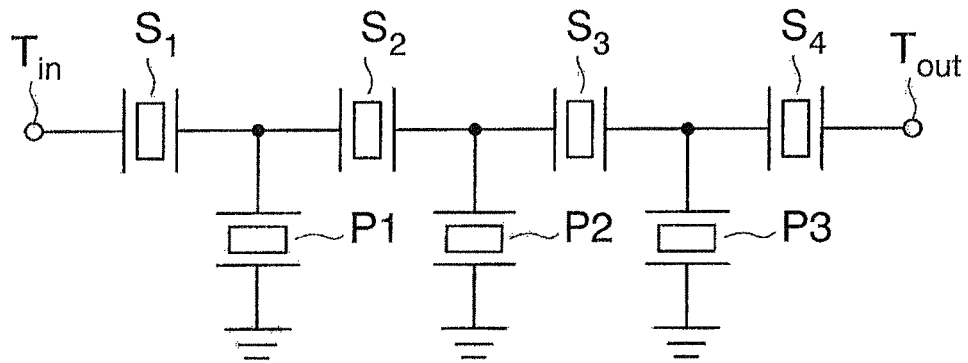
FIG. 8A is an equivalent circuit diagram of a ladder type filter composed of series resonators S1 to S4 and parallel resonators P1 to P3.
Figure 8B:
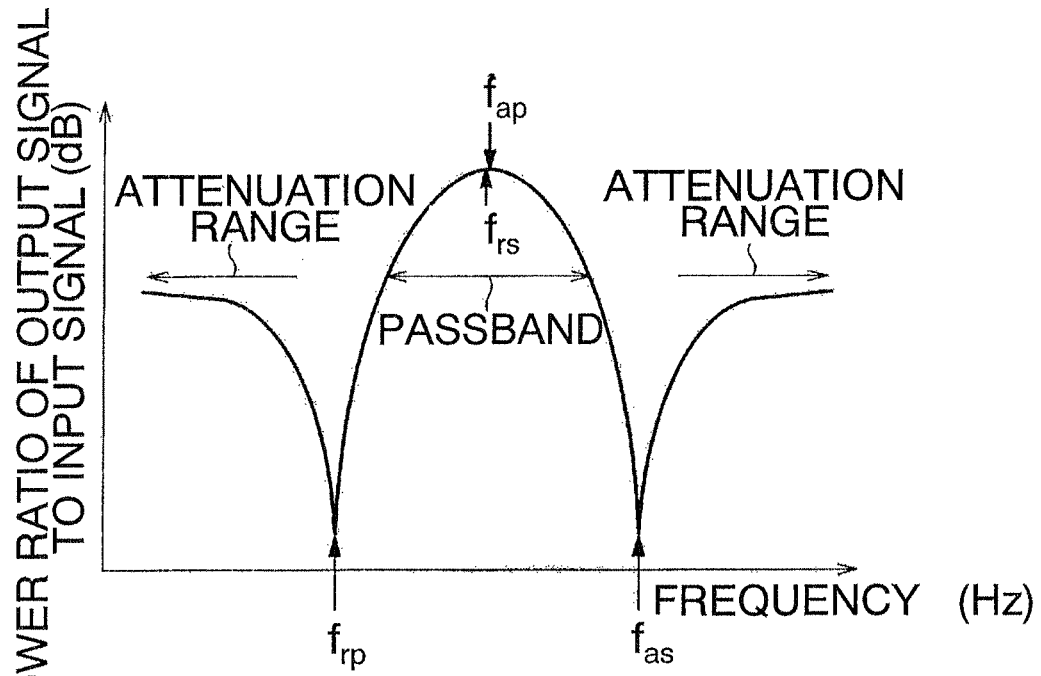
FIG. 8B depicts passage characteristic of the filter.

FIG. 8A is an equivalent circuit diagram of a ladder type filter composed of series resonators S1 to S4 and parallel resonators P1 to P3. FIG. 8B shows passage characteristic of the filter. The resonance frequencies frs of the series resonators S1 to S4 and the anti-resonance frequencies fas of the parallel resonators P1 to P3 are set at substantially the same level, and a band-pass filter is configured.

Figure 9A:
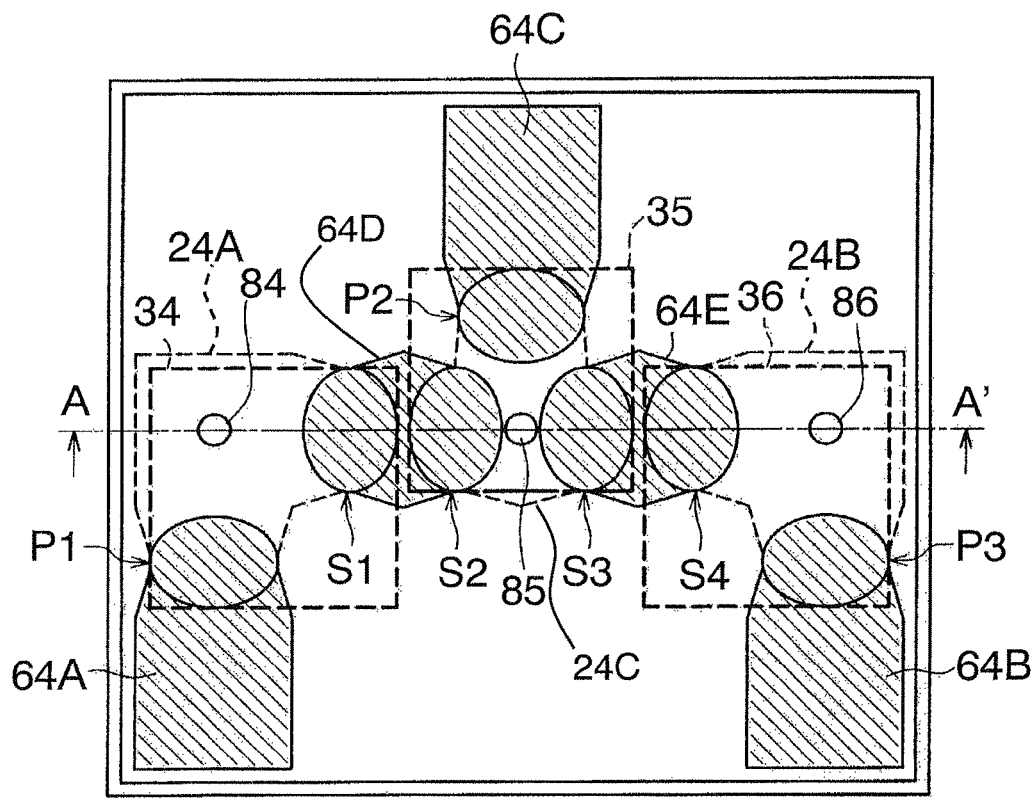
FIG. 9A is a top view of a ladder type filter corresponding to the equivalent circuit diagram of FIG. 8A.
Figure 9B:
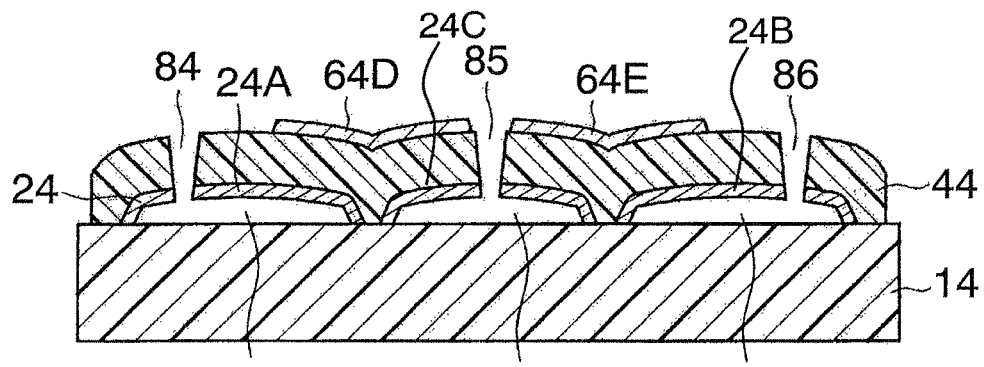
FIG. 9B is a sectional view taken along the line A-A' of FIG. 9A.

FIG. 9A is a top view of a ladder type filter corresponding to the equivalent circuit diagram of FIG. 8A. FIG. 9B is a sectional view taken along the line A-A' of FIG. 9A.

The series resonators S1 to S4 and the parallel resonators P1 to P3 include membrane regions where lower electrodes 24A, 24B, and 24C and upper electrodes 64A, 64B, and 64C oppose each other across a piezoelectric membrane 44 respectively. These seven resonators are formed on three cavities 34, 35, and 36, each region of which is indicated by heavy dotted line. In other words, the resonators S1 and P1 share the cavity 34, the resonators S2, S3, and P2 share the cavity 35, and the resonators S4 and P3 share the cavity 36. Then, through-holes 84, 85, and 86 for removing sacrifice layers are formed at around the each center of the cavities 34, 35, and 36. The individual form of the cavities 34, 35, and 36 is domical.

The membrane regions of the series resonator S1 and the parallel resonator P1 shares the lower electrode 24A which corresponds to the input terminal Tin of the ladder type filter shown in FIG. 8A. The membrane regions of the series resonator S4 and the parallel resonator P3 share the lower electrode 24B which corresponds to the output terminal Tout of the ladder type filter in FIG. 8A. The upper electrodes 64A, 64B, and 64C for the corresponding membrane regions of the parallel resonators P1, P2, and P3 are connected each other and correspond to a ground terminal. Here, although not shown, an additional film made of Ti may be formed on the upper electrodes 64A, 64B, 64C of the parallel resonators P1 to P3. The series resonators S1 and S2 share the upper electrode 64D, and the series resonators S3 and S4 share the upper electrode 64E. By controlling a thickness of the additional film, resonance frequencies of the parallel resonators P1 to P3 may be adjusted to achieve a desired characteristics of the band-pass filter. A method for adjusting the resonance frequency is not limited to the above one.

The acoustic wave device of the first embodiment includes FBARs such as S2 and S3 which share the cavity 35 and the through-hole 85 in the outside of the membrane regions composed of a piezoelectric membrane 44. Accordingly, S2 and S3 may be formed pretty close to each other. Further, since plural FBARs share a cavity, the number of through-holes can be reduced, with the result that a filter device can be downsized.

This embodiment describes an example where the seven resonators S1 to S4 and P1 to P3 share the three cavities 34 to 36, but a cavity may be shared in another way. For example, the series resonators S1 to S4 and the parallel resonators P1 to P3 may share one cavity. Alternatively, the resonators S1 to S4 may share one cavity, and the parallel resonators P1, P2, and P3 may have individual cavities.

Although this embodiment describes an example of the ladder type filter, the other type filters may be similarly manufactured and similar advantages may be obtained. Further, modules such as a duplexer using the filter of the embodiment and communication apparatuses using the filter are considered as an embodiment of the present invention.

Third Embodiment

Figure 10:
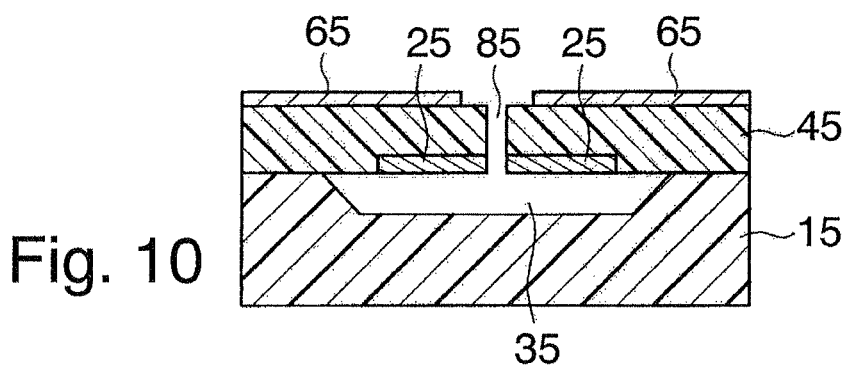
FIG. 10 is a sectional view of an acoustic wave device of the third embodiment.

According to a third embodiment of the present invention, a cavity is formed in the substrate in a buried form by a substrate surface processing method. FIG. 10 is a sectional view of an acoustic wave device of the third embodiment. In the acoustic wave device in FIG. 10, a portion on the surface of a substrate 15 is processed into a cavity (cavity space) 35, and a region (membrane region) where a lower electrode 25 and an upper electrode 65 are laminated through a piezoelectric membrane 45 is formed on the cavity 35. Two membrane regions are formed on the cavity 35. In other words, two FBARs share one cavity 35.

The cavity 35 may be formed in a similar manner to the first embodiment. For example, after the formation of a sacrifice layer in a dimple or a cavity formed in the substrate, the lower electrode 25, the piezoelectric membrane 45, and the upper electrode 65 are laminated and then, the sacrifice layer is removed through the through-hole 85 to thereby obtain the cavity 35.

In this way, the cavity is formed based on the substrate surface processing method, making it possible to form the piezoelectric membrane 45 along the flat surface. Thus, a piezoelectric membrane having high orientation can be obtained. As a result, a distance between membrane regions may be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An acoustic wave device comprising:
a substrate; and
a plurality of piezoelectric thin film resonators formed over the substrate, each of the plurality of the piezoelectric thin film resonators including,
  a lower electrode provided on the substrate,
  a piezoelectric film provided on the lower electrode, and
  an upper electrode provided on the piezoelectric film and opposed to the lower electrode through the piezoelectric film, each of the piezoelectric thin film resonators being partly supported by the substrate and extending above the substrate to form a cavity between the substrate and the lower electrode, the cavity being continuously extended under at least two of the plurality of the piezoelectric thin film resonators so as to be shared by said at least two of the plurality of the piezoelectric thin film resonators,
wherein a through hole is formed to extend from an upper surface of the piezoelectric thin film resonators and penetrate the lower electrode of at least one of said at least two of the plurality of piezoelectric thin film resonators sharing the cavity, the through hole being positioned away from peripheral edges of the cavity and the upper electrode as viewed in a plan view,
wherein said at least two of the plurality of the piezoelectric thin film resonators that share the cavity include at least one series resonator and at least one parallel resonator that form a ladder type filter,
wherein a plurality of said cavities are provided, and each of the plurality of the cavities is shared by a different set of the at least two of the plurality of piezoelectric thin film resonators, and
wherein for each cavity, the number of the through hole is less than the number of the resonators that form the ladder type filter.

2. The acoustic wave device according to claim 1, wherein the the plurality of the cavities is formed on a flat surface of the substrate.

3. The acoustic wave device according to claim 1, wherein the piezoelectric film is made of either aluminum nitride or zinc oxide each of which has an orientation showing a principal axis of (002) direction.

4. The acoustic wave device according to claim 1, wherein a single lower electrode is shared by said at least two of the plurality of piezoelectric thin film resonators sharing the cavity as the respective lower electrodes, and the through hole penetrates the single lower electrode.

5. The acoustic wave device according to claim 1, wherein over each cavity, the through hole is formed in a gap between two or more of the upper electrodes that are adjacent to each other.

6. The acoustic wave device according to claim 5, wherein a single lower electrode is shared by said at least two of the plurality of piezoelectric thin film resonators sharing the cavity as the respective lower electrodes, and the through hole penetrates the single lower electrode.

7. The acoustic wave device according to claim 1, wherein for at least one of the plurality of cavities, the through hole is positioned at or adjacent a center of each cavity.

8. The acoustic wave device according to claim 1, wherein no through hole reaching the cavity is formed adjacent to any peripheral edge of each cavity.

9. The acoustic wave device according to claim 1, wherein a single lower electrode is shared by said at least two of the plurality of piezoelectric thin film resonators sharing the cavity as the respective lower electrodes,
wherein over at least one of the plurality of cavities, the through hole is formed in a gap between two or more of the upper electrodes that are adjacent to each other, and the through hole penetrates the single lower electrode and is positioned at or adjacent a center of the cavity, and
wherein no through hole reaching the cavity is formed adjacent to any peripheral edge of each cavity.

10. An acoustic wave device comprising:
a substrate; and
a plurality of piezoelectric thin film resonators formed over the substrate, each of the plurality of the piezoelectric thin film resonators including,
a lower electrode provided on the substrate,
a piezoelectric film provided on the lower electrode, and
an upper electrode provided on the piezoelectric film and opposed to the lower electrode through the piezoelectric film, each of the piezoelectric thin film resonators being partly supported by the substrate and extending above the substrate to form a cavity between the substrate and each lower electrodes,
wherein the cavity continuously extends under the plurality of the piezoelectric thin film resonators so as to be shared by the plurality of the piezoelectric thin film resonators,
wherein a through hole is formed to extend from an upper surface of the piezoelectric thin film resonators and penetrate the lower electrode of at least one of the plurality of piezoelectric thin film resonators, the through hole being positioned away from peripheral edges of the cavity as viewed in a plan view, and
wherein the cavity has a shape of a domical protrusion.

11. A transmission apparatus comprising:
an acoustic wave device including,
a substrate; and
a plurality of piezoelectric thin film resonators formed over the substrate,
each of the plurality of the piezoelectric thin film resonators including,
a lower electrode provided on the substrate,
a piezoelectric film provided on the lower electrode, and
an upper electrode provided on the piezoelectric film and opposed to the lower electrode through the piezoelectric film, each of the piezoelectric thin film resonators being partly supported by the substrate and extending above the substrate to form a cavity between the substrate and the lower electrode, the cavity being continuously extended under at least two of the plurality of the piezoelectric thin film resonators so as to be shared by said at least two of the plurality of the piezoelectric thin film resonators,
wherein a through hole is formed to extend from an upper surface of the piezoelectric thin film resonators and penetrate the lower electrode of at least one of said at least two of the plurality of piezoelectric thin film resonators sharing the cavity, the through hole being positioned away from peripheral edges of the cavity and the upper electrode as viewed in a plan view,
wherein said at least two of the plurality of the piezoelectric thin film resonators that share the cavity include at least one series resonator and at least one parallel resonator that form a ladder type filter,
wherein a plurality of said cavities are provided, and each of the plurality of the cavities is shared by a different set of the at least two of the plurality of piezoelectric thin film resonators, and
wherein for each cavity, the number of the through hole is less than the number of the resonators that form the ladder type filter.

12. A method of manufacturing an acoustic wave device comprising:
forming a plurality of sacrifice layer patterns on a substrate for providing a plurality of cavities, respectively;
on each of the plurality of sacrifice layer patterns and on the substrate, laminating a lower electrode, a piezoelectric thin film, and upper electrodes to provide a plurality of portions of the piezoelectric thin film sandwiched by the lower electrode and the upper electrodes over each of the plurality of sacrifice layer patterns;
forming a through hole extending from an upper surface of a structure formed in the step of laminating and penetrating the lower electrode over each of the plurality of sacrifice layer patterns, the through hole being positioned away from peripheral edges of the sacrifice layer patterns and the upper electrodes as viewed in a plan view; and
removing the sacrifice layer patterns by an etchant through the respective through holes to form the plurality of cavities each shared by the plurality of portions of the piezoelectric thin film, each of the plurality of cavities being shared by a different plurality of portions of the piezoelectric thin film,
wherein the plurality of the portions of the piezoelectric thin film that shares the cavity include at least one series resonator and at least one parallel resonator that form a ladder type filter, and
wherein for each cavity, the number of the through hole is less than the number of the resonators that form the ladder type filter.

* * * * *